United States Patent [19]
Vermeersch et al.

[11] Patent Number: 5,667,939
[45] Date of Patent: Sep. 16, 1997

[54] METHOD FOR OBTAINING A LITHOGRAPHIC PRINTING PLATE UTILIZING A DIAZO-BASE IMAGING ELEMENT CONTAINING A DISPERSED WATER INSOLUBLE POLYMER

[75] Inventors: Joan Vermeersch, Deinze; Dirk Kokkelenberg, St. Niklaas, both of Belgium

[73] Assignee: Agfa-Gevaert, N.V., Mortsel, Belgium

[21] Appl. No.: 629,136

[22] Filed: Apr. 8, 1996

[30] Foreign Application Priority Data

May 16, 1995 [DE] Germany .................. 95201271.4

[51] Int. Cl.$^6$ .................. G03F 7/32; G03F 7/40
[52] U.S. Cl. .................. 430/302; 430/330; 430/331
[58] Field of Search .................. 430/302, 330, 430/331, 157, 158, 176

[56] References Cited

U.S. PATENT DOCUMENTS 5,200,291   4/1993   Wanat .................. 430/302

*Primary Examiner*—Janet C. Baxter
*Assistant Examiner*—Christopher G. Young
*Attorney, Agent, or Firm*—Breiner & Breiner

[57] ABSTRACT

The present invention provides a method for obtaining a lithographic printing plate comprising the steps of (i) image-wise exposing an imaging element comprising on a hydrophilic surface of a support a light sensitive layer containing a diazo resin or a diazonium salt and a dispersed water-insoluble polymer with a melting point or glass transition temperature above 40° C. and capable of coagulating when heated at or above its melting point or glass transition temperature, and (ii) subsequently removing the light sensitive layer in the non-exposed or insufficiently exposed areas of said imaging element by means of rinsing or washing said imaging element with plain water, characterized in that afterwards said developed image-wise exposed imaging element is heat-treated at a temperature at least equal to the glass transition temperature or melting point of said dispersed water-insoluble polymer.

10 Claims, No Drawings

METHOD FOR OBTAINING A LITHOGRAPHIC PRINTING PLATE UTILIZING A DIAZO-BASE IMAGING ELEMENT CONTAINING A DISPERSED WATER INSOLUBLE POLYMER

1. FIELD OF THE INVENTION

The present invention relates to a a method for making a lithographic printing plate from a diazo sensitized imaging element by development with plain water.

2. BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers.

Particularly diazo-sensitized systems are widely used. These systems have been extensively reviewed by Kosar J. in "Light-Sensitive Systems", Wiley, New York, 1965, Chapter 7. A generally used negative-working diazo-sensitized system is based on the capability of diazo compounds to harden a polymer when exposed to ultraviolet and blue radiation. Diazo compounds which have been used for the preparation of lithographic printing plates based on their hardening properties are e.g. diazonium salts whose photolysis products can harden polymers (natural colloids or synthetic resins) directly and dizonium polymers. Although polymers containing diazonium groups have a large structure they remain water soluble owing to the presence of the ionic diazonium groups. When these groups are destroyed by exposure to light an insoluble resin is formed. Particularly useful diazonium polymers are the condensation products of a carbonyl compound, e.g. an aldehyde, such as formaldehyde, with a diazonium salt of e.g. a p-aminodiphenylamine. These condensation products are usually designated diazo resins. In these systems a polymeric binder is optionally added to the diazo resin coating.

Several types of supports can be used for the manufacturing of a diazo-sensitized lithographic printing plate. Common supports are metal supports like Al or Zn, polyester film supports and paper bases. These supports, if not sufficient hydrophilic by themselves, are first coated with a hydrophilic layer to form the hydrophilic background of the printing plate and a top layer containing the diazo compound is then applied (see for example DE-P-1900469, DE-P-2030634 and U.S. Pat. No. 3,971,660).

It is known to use as hydrophilic layer in these systems a layer containing polyvinyl alcohol and hydrolyzed tetraethyl orthosilicate and preferably also silicium dioxide and/or titanium dioxide as described in e.g. GB-P-1419512, FR-P-2300354, U.S. Pat. Nos. 3,971,660 and 4,284,705. This hydrophilic layer is overcoated with a light-sensitive layer containing a diazonium salt or a diazo resin in a polymeric binder.

Upon image-wise exposure of the light-sensitive layer the exposed image areas become water insoluble and the unexposed areas remain water soluble. The plate is then developed with water to remove the diazonium salt or diazo resin in the unexposed areas. Such development may take place by means of plain water as disclosed in e.g. EP-A-450199 and EP-A-601240.

It has however been found that the printing endurance of a lithographic printing plate obtained from diazo based imaging elements is not very high.

3. SUMMARY OF THE INVENTION

It is an object of the present invention to provide a method for producing from a diazo based imaging element a lithographic printing plate having an improved printing endurance.

Other objects will become apparent from the description hereinafter.

According to the present invention there is provided a method for obtaining a lithographic printing plate comprising the steps of (i) image-wise exposing an imaging element comprising on a hydrophilic surface of a support a light sensitive layer containing a diazo resin or a diazonium salt and a dispersed water-insoluble polymer with a melting point or glass transition temperature above 40° C. and capable of coagulating when heated at or above its melting point or glass transition temperature, and (ii) subsequently removing the light sensitive layer in the non-exposed or insufficiently exposed areas of said imaging element by means of rinsing or washing said imaging element with plain water, characterized in that afterwards said developed image-wise exposed imaging element is heat-treated at a temperature at least equal to the glass transition temperature or melting point of said dispersed water-insoluble polymer.

4. DETAILED DESCRIPTION

It has been found that the printing endurance of a lithographic printing plate obtained from diazo based imaging elements is markedly improved when the imaging element contains in the light sensitive layer a dispersed water-insoluble polymer with a melting point or glass transition temperature above 40° C. and capable of coagulating when heated at or above its melting point or glass transition temperature, and said imaging element is, after image-wise exposure and development by means of rinsing or washing with plain water, subsequently heat-treated at a temperature at least equal to the glass transition temperature or melting point of said dispersed water-insoluble polymer.

The melting point or glass transition temperature of said dispersed water-insoluble polymer lies preferably below 200° C., more preferably below 150° C., most preferably below 120° C.

The temperature of the heat-treatment is preferably at least 20° C., more preferably at least 40° C. most preferably at least 60° C. higher than the melting point or glass transition temperature of said dispersed water-insoluble polymer.

An aqueous dispersion of said water-insoluble polymer is preferably cationic or nonionic either e.g. as a result of an emulsifier or by having the cationic or nonionic group linked to the polymer. The water-insoluble polymer is preferably a solid particulate having a size in the range of about 100

Angstroms to 1 micron in diameter and not forming a film below 40° C. In general, any polymer which carries a cationic or nonionic group or which can be formulated into an emulsion using a cationic or nonionic emulsifier, has a melting point or glass transition temperature above 40° C. and is capable of coagulating when heated at or above its melting point or glass transition temperature can be employed in the present invention. Suitable polymers include homopolymers and copolymers of styrene, methylacrylate, ethylacrylate, butylacrylate, methylmethacrylate, ethylmethacrylate, butyl methacrylate, vinyl acetate, vinyl chloride, vinylidene chloride, butadiene, methyl styrene, vinyl toluene, dimethylaminoethyl acrylate, acrylic acid, methacrylic acid, isoprene, chloroprene, malei anhydride, ethylene glycol acrylates such as polyethylene glycol acrylate, halogenated vinyl aromatics such as chlorostyrene and bromostyrene, methylvinyl ether, vinyl pyrrolidone, polyurethane and the like.

Among the cationic and nonionic emulsifiers which can be used in the present invention are: ammonium salts of substituted amines containing alkyl and/or aryl groups attached to the nitrogen, alkyl or aryl sulfonium salts, alkyl and alkyl-aryl polyethers, cationic or nonionic fluorosurfactants and polyoles.

The light sensitive layer of an imaging element in connection with the present invention preferably contains a diazonium salt or diazo resin and a hydrophilic binder. A suitable hydrophilic binder is for example pullulan.

Pullulan is a polysacharide that is produced by microorganisms of the Aureobasidium pullulans type (Pullularia pullulans) and that contains maltotriose repeating units connected by a α-1,6 glycosidic bond. Pullulan is generally produced on industrial scale by fermentation of partially hydrolysed starch or by bacterial fermentation of sucrose. Pullulan is commercially available from e.g. Shodex, Pharmacosmos.

Preferably the light sensitive layer contains polyvinylacetate hydrolysed to an extent of at least 95% by weight as a binder. Most preferably the binder of the light sensitive layer is a polyvinyl acetate hydrolysed to an amount of 97% to 100% by weight. Preferably the number average molecular weight of the polyvinylacetate is at least 35000 g/mol and more preferably at least 50000 g/ml.

Preferably the light sensitive layer further includes a cationic fluor containing surfactant, preferably a perfluorinated surfactant and more preferably a perfluorinated ammonium surfactant. Typical examples of perfluorinated ammonium surfactants are:

n.$C_8F_{17}SO_2NH$—$(CH_2)_3N^+(CH_3)_3I^-$ (Fluorad FC 135 from 3M)

n.$C_9F_{19}SO_2NH$—$(CH_2)_4N^+(CH_3)_3Br^-$ n.$C_7F_{15}CONH$—$(CH_2)_3N^+(CH_3)_3I^-$ (n.$C_8F_{17}COO$—$(CH_2)_4)_2N^+(CH_3)_2I^-$

The cationic fluor containing surfactant is preferably used in an amount between 3 mg/m$^2$ and 100 mg/m$^2$, more preferably between 5 mg/m$^2$ and 55 mg/m$^2$.

Examples of low-molecular weight diazonium salt for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde.

Examples of diazo resins useful in the present invention include condensation products of an aromatic diazonium salt as the light-sensitive substance. Such condensation products are known and are described, for example, in German Pat. no. 1214086. They are in general prepared by condensation of a polynuclear aromatic diazonium compound, preferably of substituted or unsubstituted diphenylamine-4-diazonium salts, with active carbonyl compounds, preferably formaldehyde, in a strongly acid medium.

The thickness of the light-sensitive layer in the material of this invention may vary in the range of 0.1 to 10 μm and is preferably between 0.5 and 2.5 μm.

Hydrophilic surfaces of a support for use in connection with the present invention are preferably metallic supports having a hydrophilic surface e.g. a roughened and anodized aluminum support. Alternatively supports that are rendered hydrophilic by means of a hydrophilic layer provided on at least one surface of the support can also be used.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

Preferably the aluminum foil has a roughness with a CLA value between 0.2 and 1.5 μm and an anodization layer with a thickness between 0.4 and 2.0 μm.

According to the present invention the roughening of the aluminum foil can be performed according to the methods well known in the prior art.

The surface of the aluminum substrate can be toughened either by mechanical, chemical or electrochemical graining or by a combination of these to obtain a satisfactory adhesiveness of a light sensitive layer to the aluminum support and to provide a good water retention property to the non-printing areas that will form the non-printing areas on the plate surface.

Mechanical graining can be performed by e.g. sand blasting, ball graining, wire graining, brush graining, slurry graining or a combination of these, etc.

Chemical graining can be done e.g. by alkaline etching as disclosed in Jap. Patent Application No. 61304/76, with a saturated aqueous solution of an aluminum salt of a mineral acid, etc.

The electrochemical graining process is preferred because it can form a uniform surface roughness having a large average surface area with a very fine and even grain which is commonly desired when used for lithographic printing plates.

To obtain a finely grained surface topography the optimum concentration and temperature of the electrolytic solution, the current form and density must be chosen.

According to the present invention electrochemical graining can be conducted in a hydrochloric and/or nitric acid containing electrolyte solution using an alternating or direct current. Other aqueous solutions that can be used in the electrochemical graining are e.g. acids like $HNO_3$, $H_2SO_4$, $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc.

Electrochemical graining in connection with the present invention can be performed using single-phase and three-phase alternating current. Alternating current waves can be a sine wave, a square wave, trapezoidal wave, etc. The anodic charge may be greater or lower than the cathodic charge. The voltage applied to the aluminum plate is about 1–60 V and preferably 10–35 V. A current density of 3–150

Amp/dm$^2$ is employed for 5–240 seconds. The temperature of the electrolytic graining solution may vary from 5°–50° C. Electrochemical graining is carried out preferably with an alternating current from 10 Hz to 300 Hz.

Mechanical and electrochemical methods may be combined as disclosed in U.S. Pat. No. 4,476,006 and 4,477,317.

The toughening is preferably preceded by a degreasing treatment mainly for removing greasy substances from the surface of the aluminum foil.

Therefore the aluminum foil may be subjected to a degreasing treatment with a surfactant and/or an aqueous alkaline solution to thereby remove rolling oil, dust, rust and other impurities on the surface thereof. Degreasing can be performed by a 2-step treatment either treating the aluminum foil with an alkaline solution followed by a desmutting in an acidic solution or degreasing in an acidic solution followed by an alkaline desmutting. Acidic solutions preferably contain chromic acid, phosphoric acid or sulphuric acid, and usable alkaline solutions may contain NaOH, KOH, etc.

Preferably toughening is followed by a chemical etching step using an aqueous solution containing an acid. The chemical etching is preferably carried out at a temperature of at least 30° C. more preferably at least 40° C. and most preferably at least 50° C. When too low temperatures during chemical etching are employed a poor adhesion of the light sensitive layer to the aluminum foil may result. There is no specific upper limit as to the temperature of chemical etching but for convenience the temperature will generally be kept below the boiling point of the solution preferably below 90° C.

Suitable acids for use in the aqueous etch solution are preferably inorganic acids and most preferably strong acids. Examples of acids that are particularly suitable are e.g. $H_2SO_4$, HCl, $HNO_3$, HF, $H_3PO_4$ etc. or mixtures thereof. Weak acids may also be used in admixture with strong acids. The total amount of acid in the aqueous etch solution is preferably at least 150 g/l, more preferably at least 200 g/l and most preferably at least 250 g/l. The actual amount of acid is determined e.g. by temperature and duration of etching. Generally lower amounts of acid can be used with increasing temperature and duration. The duration of chemical etching is preferably between 3 s and 5 min. and more preferably between 3 s and 4 min.

Alternatively chemical etching may be carried out using an aqueous solution containing alkali. Suitable alkali are e.g. sodium hydroxide, potassium hydroxide etc. Preference is however given to chemical etching using an acidic solution or to chemical etching using in the order given an alkaline solution, an optional rinsing solution and an acid solution since it has been found that the effect of the posttreatment of the aluminum foil using a bicarbonate solution after anodization is much more pronounced when the chemical etching is done as described above.

According to the present invention after the roughening of the aluminum foil and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used at a temperature in the range from 0°–70° C. preferably at a temperature in the range from 35°–60° C., more preferably at a temperature in the range from 40°–50° C. The anodic current density may vary from 1–50 A/dm$^2$ and the voltage within the range 1–100 V to obtain an anodized film weight of 1–8 g/m$^2$ $Al_2O_3.H_2O$. The anodized aluminum foil may subsequently be rinsed with demineralised water at a temperature in the range of 10°–80° C.

After the anodizing step a posttreatment by means of an aqueous solution containing a bicarbonate can be applied to the anodic surface. Suitable bicarbonates are e.g. sodium bicarbonate, potassium bicarbonate, ammonium bicarbonate, calcium bicarbonate, barium bicarbonate etc. Sodium bicarbonate is preferably used. The amount of bicarbonate in the aqueous solution is preferably between 0.05 mol/l and 1 mol/l, more preferably between 0.1 mol/l and 0.7 mol/l and most preferably between 0.1 mol/l and 0.5 mol/l. The pH of the aqueous solution is preferably between 4 and 10.

Preferably each of the above described steps is separated by a rinsing step to avoid contamination of the liquid used in a particular step with that of the preceding step.

Supports that can be provided with a hydrophilic layer are e.g. photographic film bases e.g. substrated polyethylene terephthalate film, cellulose acetate film, plastics having a metal layer or deposit thereon, a metal support, e.g. aluminium and polyolefin (e.g. polyethylene) coated paper, the polyolefin surface of which may have been subjected to a corona discharge to improve the adherence of a hydrophilic layer.

As hydrophilic (co)polymers in said hydrophilic layer one may use, for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is the same as or higher than the hydrophilicity of polyvinyl acetate hydrolyzed to at least an extent of 60 percent by weight, preferably 80 percent by weight.

Examples of hydrolyzed tetraalkyl orthosilicate crosslinking agents are hydrolyzed tetraethyl orthosilicate and hydrolyzed tetramethyl orthosilicate.

The amount of tetraalkyl orthosilicate crosslinking agent is preferably at least 0.2 parts by weight per part by weight of hydrophilic (co)polymer, more preferably between 0.5 and 5 parts by weight, most preferably between 1.0 parts by weight and 3 parts by weight.

Said hydrophilic layer preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the layer is given a uniform rough texture consisting of microscopic hills and valleys, which serve as storage places for water in background areas.

The thickness of the hydrophilic layer may vary in the range of 0.2 to 25 µm and is preferably 1 to 10 µm.

In accordance with a preferred embodiment there is provided an intermediate layer of an organic compound having a cationic group between the hydrophilic surface of the support and the light sensitive layer. As a consequence the development by plain water of such a diazo based imaging element is improved.

Organic compounds having a cationic group for use in the intermediate layer are preferably hydrophilic and may be low molecular weight compounds e.g. ethanolamine but are more preferably polymers. Preferred compounds are those having one or more ammonium groups or amino groups that can be converted to ammonium groups in an acidic medium. An especially preferred type of cationic compounds are polysacharides modified with one or more groups containing an ammonium or amino group.

Most preferred organic compounds having cationic groups are dextrans or pullulan wherein at least some of the hydroxy groups of the dextran or pullulan has been modified into one or more of the following groups:

—O—R$^1$

—O—CO—R$^2$ wherein R$^1$ represents an organic residue containing an amino or ammonium group, e.g. an amine substituted alkyl, an amine substituted alkylaryl etc . . . . , R$^2$ has one of the significances given for R$^1$ or stands for —OR$^3$ or —N(R$^4$)R$^5$, wherein R$^3$ has one of the significances given for R$^1$ and each of R$^4$ and R$^5$ which may be the same or different and have one of the significances given for R$^1$.

Examples of dextrans or pullulan that can be used in accordance with the present invention are dextrans or pullulan wherein some of the hydroxyl groups have been modified in one of the groups shown in table 1.

TABLE 1

| no. | modified group |
|---|---|
| 1 | —O—CH$_2$—CH$_2$—NH$_2$ |
| 2 | —O—CO—NH—CH$_2$—CH$_2$—NH$_2$ |
| 3 | —O—CO—NH—CH$_2$—CH$_2$—N(CH$_2$—CH$_2$—NH$_2$)$_2$ |
| 4 | —O—CH$_2$—CH$_2$—NH—CH$_2$—CH$_2$—NH$_2$ |
| 5 | —O—CH$_2$—CH$_2$—NH—CH$_2$—CHOH—CH$_2$—N$^+$(CH$_3$)$_3$ Cl$^-$ |
| 6 | —O—(CH$_2$—CH$_2$—O)$_n$—CH$_2$—CH$_2$—NH$_2$ wherein n represents an integer from 1 to 50 |
| 7 | —O—CO—NH—CH$_2$—CH$_2$—NH—CH$_2$—CHOH—CH$_2$—N$^+$(CH$_3$)$_3$ Cl$^-$ |
| 8 | —O—CH$_2$—CH$_2$—N(CH$_2$—CH$_3$)$_2$ .HCl |
| 9 | —O—CH$_2$—CH$_2$—N(CH$_2$—CH$_2$—NH$_2$)$_2$ |
| 10 | —O—CONH—CH$_2$—CH$_2$—N(CH$_2$—CH$_2$—NH$_2$)$_2$ |
| 11 | —O—CONH—(CH$_2$—CH$_2$—O)$_n$—CH$_2$—CH$_2$—NH$_2$ |

The modified dextrans or pullulan can be prepared by a reaction with e.g. alkylating agents, chloroformates, acid halides, carboxylic acids etc . . . .

The intermediate layer containing the organic compound having one or more cationic groups is preferably provided in an amount of 5 to 500 mg/m$^2$ and more preferably in an amount of 10 to 200 mg/m$^2$.

The imaging element in connection with the present invention advantageously contains water-soluble dyes such as rhodamines, sudan blue, methylen blue, eosin or trifenyl-methane dyes such as crystal violet, victoria pure blue, malachite green, methylviolet and fuchsin or dye pigments. These colorants may be incorporated in the light sensitive layer and/or hardened hydrophilic layer when present.

To obtain a lithographic printing plate from an imaging element according to the invention said imaging element is image-wise exposed, subsequently developed by means of rinsing or washing preferably with plain water to remove diazo resin or diazonium salts in the non-exposed or insufficiently exposed parts of the imaging element and finally heat-treated at a temperature at least equal to the glass transition temperature or melting point of said dispersed water-insoluble polymer.

The exposure of the imaging element used in the present invention advantageously proceeds with ultraviolet light optionally in combination with blue light in the wavelength range of 250 to 500 nm. Useful exposure sources are high or medium pressure halogen mercury vapour lamps, e.g. of 1000 W. Since most lithography is done by the offset process, the imaging element is preferably exposed in such a way that the image obtained thereon is right reading. The exposure may be an exposure using optics or a contact exposure.

The diazo resin or diazonium salts are converted upon exposure from water soluble to water insoluble (due to the destruction of the diazonium groups) and additionally the photolysis products of the diazo may induce an advancement in the level of crosslinking of the polymeric binder or diazo resin, thereby selectively converting the surface, in an image pattern, from water soluble to water insoluble. The unexposed areas remain unchanged, i.e. water soluble.

The following example illustrate the present invention without being limited thereto. The percentages given are by weight unless otherwise stated.

EXAMPLE

Preparation of a lithographic base

A 0.30 mm thick aluminum foil (AA 1050) was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 0.5 g/l of aluminum ions at a temperature of 35° C. and a current density of 1200 A/m$^2$ to form a surface topography with an average center-line roughness Ra of 0.5 μm. After rinsing with demineralized water the aluminum foil was then etched with an aqueous solution containing 300 g/l of sulfuric acid at 60° C. for 180 seconds and rinsed with demineralized water of 25° C. for 30 s. The foil was subsequently subjected to anodic oxidation in an aqueous solution containing 200 g/l of sulfuric acid at a temperature of 45° C., a voltage of about 10 V and a current density of 150 A/m$^2$ for about 300 s to form an anodic oxidation film of 3.00 g/m$^2$ of Al$_2$O$_3$, then washed with demineralised water, posttreated with a solution containing 20 g/l of sodium bicarbonate at 40 ° C. for 30 s, subsequently rinsed with demineralized water of 20° C. during 120 s and finally dried.

Preparation of the imaging elements

To the lithographic base was provided an aqueous solution (pH=5) of Dormacid (a dextran modified with group 8 of table 1 above and available from Pfeifer and Langen) and a wetting agent to a dry coating thickness of 30 mg/m$^2$ of Dormacid. The obtained element was heated for 7 days at 60° C., then overcoated with the below described light sensitive coating in an amount of 35 g/m² (wet coating amount) and finally dried at 30° C.

Preparation of the light sensitive coating:

To 63 g of a 20% dispersion of polymethylmethacrylate (particle diameter of 40 nm, glass transition temperature 105° C.) stabilized with cetyltrimethylammoniumbromide in deionized water was subsequently added, while stirring, 120 g of a 5% solution of a 98% hydrolyzed polyvinylacetate, having a number average molecular weight of 90 000 g/mole (POLYVIOL W48/20 available from Wacker), in water and 15 g of a 10% dispersion of heligen blue (BASF) in water. 66 g of a 15% solution of the condensationproduct of diphenylamine diazonium salt and formaldehyde in water was then slowly added. Finally 30 g of a 1.6% solution of cationic fluor containing surfactant (Fluorad FC135 available from 3M) in water, and 726 ml of water were added.

Two samples of the above described imaging element were exposed through a mask to a high pressure halogen mercury vapour lamp of 1000 W at a distance of 70 cm for 90 s.

Subsequently the imaging elements were developed by rinsing with plain water. One sample (sample A) was in accordance with the invention heat-treated at 200° C. for 90 s while the second sample (sample B) remained untreated. Both samples were then used to print on an offset press running with a commonly employed ink and fountain solution.

It was found that the printing plate obtained according to the invention (sample A) could be used to print more than 10000 copies of excellent quality whereas the plate obtained without heat-treatment (comparative sample B) yielded less than 5000 copies of acceptable quality due to white spots in the image areas.

We claim:

1. A method for obtaining a lithographic printing plate comprising the steps of (i) image-wise exposing an imaging element comprising on a hydrophilic surface of a support a light sensitive layer containing a diazo resin and a dispersed water-insoluble polymer or a diazonium salt and a dispersed water-insoluble polymer, said dispersed water-insoluble polymer having a melting point or glass transition temperature above 40° C. and capable of coagulation when heated at or above its melting point or glass transition temperature, and (ii) subsequently removing the light sensitive layer in the non-exposed or insufficiently exposed areas of said imaging element by means of rinsing or washing said imaging element with plain water, and thereafter said developed image-wise exposed imaging element being heat-treated at a temperature at least equal to the glass transition temperature or melting point of said dispersed water-insoluble polymer.

2. A method for obtaining a lithographic plate according to claim 1 wherein the melting point or glass transition temperature of said dispersed water-insoluble polymer lies below 200° C.

3. A method for obtaining a lithographic plate according to claim 2 wherein the melting point or glass transition temperature of said dispersed water-insoluble polymer lies below 150° C.

4. A method for obtaining a lithographic plate according to claim 2 wherein the melting point or glass transition temperature of said dispersed water-insoluble polymer lies below 120° C.

5. A method for obtaining a lithographic plate according to claim 1 wherein the temperature of the heat-treatment is at least 20° C. higher than the melting point or glass transition temperature of said dispersed water-insoluble polymer.

6. A method for obtaining a lithographic plate according to claim 5 wherein the temperature of the heat-treatment is at least 40° C. higher than the melting point or glass transition temperature of said dispersed water-insoluble polymer.

7. A method for obtaining a lithographic plate according to claim 5 wherein the temperature of the heat-treatment is at least 60° C. higher than the melting point or glass transition temperature of said dispersed water-insoluble polymer.

8. A method for obtaining a lithographic plate according to claim 1 wherein said imaging element further comprises an intermediate layer between said hydrophilic surface of a support and said light sensitive layer, said intermediate layer containing an organic compound having a cationic group.

9. A method for obtaining a lithographic plate according to claim 1 wherein said light sensitive layer contains as a binder a polyvinylacetate hydrolysed to an extent of at least 95% by weight and a cationic fluor-containing surfactant.

10. A method for obtaining a lithographic plate according to claim 1 wherein said hydrophilic surface of a support is a roughened and anodized aluminium support.

* * * * *